US009727416B2

(12) United States Patent
Dick (10) Patent No.: US 9,727,416 B2
(45) Date of Patent: Aug. 8, 2017

(54) VARIABLE CODE RATE SOLID-STATE DRIVE

(71) Applicant: Xilinx, Inc., San Jose, CA (US)

(72) Inventor: Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 81 days.

(21) Appl. No.: 14/789,017

(22) Filed: Jul. 1, 2015

(65) Prior Publication Data

US 2017/0004031 A1    Jan. 5, 2017

(51) Int. Cl.
| | | |
|---|---|---|
| *G11C 29/00* | (2006.01) | |
| *G06F 11/10* | (2006.01) | |
| *H03M 13/11* | (2006.01) | |
| *H03M 13/35* | (2006.01) | |
| *H03M 13/00* | (2006.01) | |
| *G11C 29/52* | (2006.01) | |

(52) U.S. Cl.
CPC ...... *G06F 11/1068* (2013.01); *G06F 11/1008* (2013.01); *G06F 11/1072* (2013.01); *G11C 29/52* (2013.01); *H03M 13/1102* (2013.01); *H03M 13/353* (2013.01); *H03M 13/635* (2013.01); *H03M 13/1111* (2013.01); *H03M 13/6393* (2013.01)

(58) Field of Classification Search
CPC .... H03M 13/03; H03M 13/13; H03M 13/152; H03M 13/251; H03M 13/255; H03M 13/353; H03M 13/635; G06F 11/1068; G06F 11/1008; G06F 11/1072
See application file for complete search history.

(56) References Cited

U.S. PATENT DOCUMENTS

| | | | |
|---|---|---|---|
| 9,007,854 B1 * | 4/2015 | Nemati Anaraki | G06F 11/10 365/189.09 |
| 9,128,858 B1 * | 9/2015 | Micheloni | G06F 11/10 |
| 2010/0241928 A1 * | 9/2010 | Kim | G06F 11/1012 714/763 |

OTHER PUBLICATIONS

Gunnam, Kiran K. et al., "Next Generation Iterative LDCP Solutions for Magnetic Recording Storage," Proc. of the 2008 42nd Asilomar Conference on Signals, Systems and Computers, Oct. 26, 2008, pp. 1148-1152, IEEE, Piscataway, New Jersey, USA.

Jeon, Seungjune, "Low-Density Parity-Check Codes for Data Storage and Memory Systems" PhD thesis paper, Dec. 2010, pp. 1-184, Carnegie Mellon University, Pittsburgh, Pennsylvania, USA.

(Continued)

*Primary Examiner* — Shelly A Chase
(74) *Attorney, Agent, or Firm* — W. Eric Webostad; David O'Brien (57) ABSTRACT

An apparatus, as well as a method therefor, relates generally to managing reliability of a solid state storage. In such an apparatus, there is a memory controller for providing a code rate. An encoder is for receiving input data and the code rate for providing encoded data. The solid-state storage is for receiving and storing the encoded data. A decoder is for accessing the encoded data stored in the solid-state storage and for receiving the code rate for providing decoded data of the encoded data accessed. The decoded data is provided as soft decisions representing probabilities of the decoded data. The memory controller is for receiving the decoded data for adjusting the code rate responsive to the probabilities of the decoded data.

20 Claims, 4 Drawing Sheets

(56) References Cited

OTHER PUBLICATIONS

Plank, James S. et al., "On the Practical Use of LDPC Erasure Codes for Distributed Storage Applications," Technical Report UT-CS-03-510, Sep. 23, 2003, pp. 1-15, University of Tennessee, Department of Computer Science, Knoxville, Tennessee, USA.
Samsung Electronics, "Samsung SSD 840 PRO Series" datasheet, May 2013, pp. 1-27, Samsung Electronics Co., Ltd., Seoul, Korea.
Wang, Jiadong et al., "Soft Information for LDPC Decoding in Flash: Mutual-Information Optimized Quantization," Proc. of the 2011 IEEE Global Telecommunications Conference, Dec. 5, 2011, pp. 1-6, IEEE, Piscataway, New Jersey, USA.

\* cited by examiner

VARIABLE CODE RATE SOLID-STATE DRIVE

TECHNICAL FIELD

The following description relates to information storage. More particularly, the following description relates to a variable code rate solid-state drive.

BACKGROUND

Solid-state flash memory continues to be rapidly inserted in to large memory storage systems. Unfortunately, solid-state flash memory conventionally has a finite number of program-erase cycles, such as for NAND or NOR flash memory cells for example, before exhibiting wear. This wear may reduce reliability of a solid-state drive. Hence, it is desirable and useful to provide a solid-state drive adaptable to such wear.

SUMMARY

A method relates generally to managing reliability of a solid-state storage. In such a method, encoded data stored in the solid-state storage is read. The encoded data accessed is decoded to provide decoded data as soft decisions representing probabilities of the decoded data. The probabilities of the decoded data are assessed. A code rate of an encoder and a decoder is adjusted responsive to the assessment.

An apparatus relates generally to managing reliability of a solid state storage. In such an apparatus, there is a memory controller for providing a code rate. An encoder is for receiving input data and the code rate for providing encoded data. The solid-state storage is for receiving and storing the encoded data. A decoder is for accessing the encoded data stored in the solid-state storage and for receiving the code rate for providing decoded data of the encoded data accessed. The decoded data is provided as soft decisions representing probabilities of the decoded data. The memory controller is for receiving the decoded data for adjusting the code rate responsive to the probabilities of the decoded data.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Solid-state drives ("SSDs") are becoming more commonly used for mass storage. Unfortunately, memory cells of SSDs have a limited number of write-read cycles before such memory cells start to degrade. This degradation can reduce reliability of such SSDs.

To increase reliability, as well as increasing useful life of SSDs, soft decoding may be used as described below in additional detail. Soft decoding refers to a decoding process where decoded information represents a probability or estimate that a data input is a particular value, which conventionally is a value between 0 and 1 used to represent a probability of either a "0" or "1" for binary coded data. This probability or estimate may indicate reliability of such decoded information. In contrast a hard-decision decoder operates on data input with a fixed set of possible values, which conventionally is either a "0" or "1" for binary coded data.

Soft decoded information may indicate reliability of such information. As described below in additional detail, a memory controller may be configured to process such soft decoded information to generate metrics therefor for setting a code rate for probabilistic encoding and decoding. Such code rate setting may be adapted to be variable so as to be adjusted for progressive wear of memory cells of solid-state storage.

With the above general understanding borne in mind, various configurations for storing information are generally described below.

Figure 1:
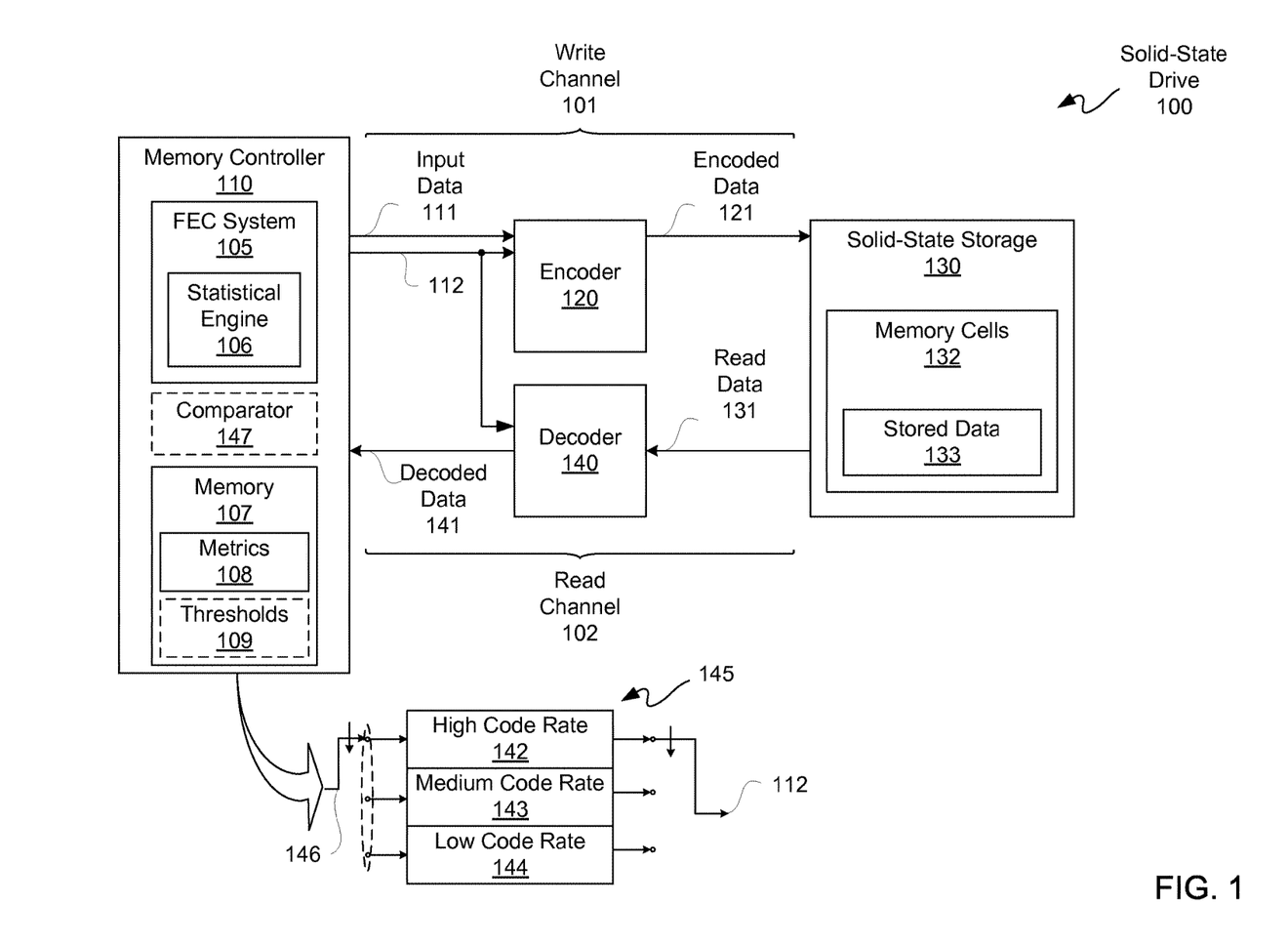
FIG. 1 is a block diagram depicting an exemplary solid-state drive ("SSD") for storing information.

FIG. 1 is a block diagram depicting an exemplary solid-state drive ("SSD") 100 for storing information. SSD 100 includes a memory controller 110, an encoder 120, solid-state storage 130, and a decoder 140. For purposes of clarity and not limitation, many known details regarding SSD 100 are not described in unnecessary detail.

Memory controller 110 may be coupled for providing a code rate 112 to encoder 120 and decoder 140. Encoder 120 may be coupled for receiving input data 111, which may be via memory controller 110 to write channel 101, as well as being coupled to receive code rate 112, to provide encoded data 121 for such input data 112 via such write channel 101. Encoded data 121 may be encoded with encoder 120 with a code rate 112 for an error correcting code. Encoded data 121 may be written to solid-state storage 130.

Such an error correcting code may be a linear error correcting code. An example of a linear error correcting code that may be used is a Low-Density Parity-Check ("LDPC") code. Along those lines, encoder 120 may be a LDPC encoder 120, and decoder 140 may be an LDPC decoder 140.

Solid-state storage 130 may be coupled for receiving and storing encoded data 121. Decoder 140 may be coupled for accessing stored encoded data ("stored data") 133 via read channel 102. Decoder 140 may be coupled for receiving code rate 112 for providing decoded data 141 of stored data 133 read, namely read data 131, via read channel 102.

Stored data 133 may be stored in memory cells 132 of solid-state storage 130. Along those lines, solid-state storage 130 may include one or more types of memory cells 132.

Memory cells 132 may be selected from a group consisting of multi-level cells ("MLCs"), binary cells, triple-level cells ("TLCs"), and single-level cells ("SLCs") for storage of encoded data 121. These memory cells 132 may be flash memory cells, such as NAND or NOR flash memory cells, for example. Memory cells 132 may exhibit wear due to write-read, or program-erase, cycles, which may reduce reliability of data stored in memory cells 132, as described below in additional detail.

Flash memory-based SSDs 100 are becoming more popular for mass storage; however, flash memory-based SSDs 100 may have memory wear. Along those lines, there may be a limited number of program-erase cycles that a NAND or NOR flash memory device can support. To increase memory density MLCs may be used, where each such memory cell 132 stores multiple data bits. These MLC-based flash memory-based SSDs 100 may store pulse-amplitude modulated ("PAM") encoded data.

A flash read channel 102 may be modeled as an Additive White Gaussian Noise ("AWGN") channel, and to increase data integrity, forward error correction ("FEC") may be used by an FEC system 105, which may be part of memory controller 110. As described below in additional detail, an FEC system 105 may be augmented with a statistical engine 106 for purposes described herein. In an implementation, memory controller 110 may optionally include a memory 107 for storing a plurality of code rates, such as code rates 142 through 144. Additionally, memory 107 may store metrics 108 and thresholds 109, as described below in additional detail.

In SSD 100, data may be encoded and decoded on-the-fly using multi-rate LDPC coding or other probabilistic coding. This multi-rate code rate is a variable code rate, which generally may start as a high code rate and progressively be stepped down to a low code rate adapted or responsive to wear of memory cells 132 of solid-state storage 130. However, multi-rate code rate may in some instances be progressively increased if for example communication of data from memory cells 132 of solid-state storage 130 improves. Generally, it shall be assumed that an SSD 100 will decrease in performance over time. This wear may be due to large numbers of write-read cycles of such memory cells 132 resulting in a reduction in reliability of such memory cells 132, or more particularly reliability of information read from such memory cells 132. A code rate 112 may be set responsive to such reliability, as described below in additional detail.

Coding rate change may be performed as online or "on-the-fly" modifications to a code rate in order to extend usable life of flash memory of solid-state storage 130. This may be useful for preserving investment in SSD-based storage systems. However, by providing a plurality of gradually lower code rates, throughput may be reduced gradually corresponding to gradual wear of such SSD 100. As is known, low-rate codes have greater redundancy to provide greater error correction at the expense of throughput. Online modification of code rate for LDPC coding, as described herein, may increase useful life of SSD 100 by increasing reliability while gradually constraining throughput over such useful life.

Decoder 140 outputs decoded data 141 which may be provided as soft decisions. By soft decisions, it is generally meant probabilities or estimates of reliability of a data state, which conventionally is either a logic 0 or a logic 1 for binary coded data. Along those lines, soft decisions and probabilities may be used interchangeably hereinbelow. Memory controller 110 may be coupled for receiving decoded data 141 for adjusting code rate 112 responsive to probabilities of decoded data 141.

FEC system or subsystem 105 may be augmented with firmware and/or hardware to provide a statistical engine 106. Statistical engine 106 may be configured to gather information from decoded data 141 and determine statistics representing "health" of solid-state storage 130. In LDPC decoding or any other variation of soft decoding, decoded data includes statistical information that describes the probability of a memory bit being either a logic 1 or a logic 0. Generally, large positive values indicate a "strong" logic 1, while large negative values indicate a "strong" logic 0. As reliability of a bit, namely representing reliability of a memory cell, becomes marginal due to memory wear, bit-level probability therefor may be reduced in magnitude.

For example, a predefined amount of data of encoded stored data 133 may be accessed, such as by a read including without limitation a burst read, from solid-state storage 130. This predefined amount of data may be for a sector or a block of stored data 133 of solid-state storage 130. Other examples of predefined amounts of data may be a subarray or array of solid-state storage 130.

Bit level probabilities for a block or sector of data may be combined to provide a reliability metric for such block or sector, respectively. Along those lines, soft decisions provided as soft bits for decoded data 141 may be provided by decoder 140 to FEC system 105 of memory controller 110. Statistical engine 106 of FEC system 105 may combine such probabilities of soft decisions, namely combine values of soft bits of decoded data 141, for a block or a sector to obtain an average of absolute values of bit level log-likelihood values as a metric 108. This average metric 108, as well as other average metrics 108 for this or other types of groupings of decoded data 141, may be stored in memory 107 of memory controller 110, or elsewhere for access by memory controller 110.

In this example, average metrics 108 are for corresponding blocks and/or sectors as block-level and/or sector-level reliability data. Along those lines, it may be determined that a block of data, which is considerably smaller than a sector of data, is defective. Rather than reducing throughput for an entire sector, such block may be address mapped to prevent use of such block. Moreover, a sector with one or more bad blocks may be address mapped to prevent use of such sector. Memory controller 110 may have a capability for blocking one or more blocks and/or one or more sectors from being used, and a control signal from statistical engine 106 based on a sufficiently low average metric 108 may be used to activate such blocking.

Such reliability information may be a vector or pointer to a threshold value of optional threshold values ("thresholds") 109, which may be stored in memory 107 of memory controller 110. Memory 107 may include one or more types of memory, including without limitation a lookup table ("LUT") or other store 145 of code rates, such as code rates 142 through 144. Such thresholds 109 may be generated offline, and thus such thresholds 109 may be predetermined for storing in memory 107 of memory controller 110 for access by statistical engine 106. Along those lines, thresholds 109 may be determined by a manufacturer regarding reliability levels in view of coding used, and thus such thresholds 109 may vary among SSD manufacturers. Generally, in an implementation, thresholds 109 may be associated with LDPC code rates, such as in a LUT 145, with lower values of block-level reliability correlating to low-rate LDPC codes for lower throughput and higher values of block-level reliability correlating to high-rate LDPC codes for higher throughput.

In this example, statistical engine 106 of memory controller 110 is configured to combine soft bits of decoded data 141 to provide an average of magnitudes thereof as an average metric 108 for comparison, such as with comparator block 147, to one or more thresholds 109. Comparator block 147 may be implemented in hardware or software, or a combination thereof.

Comparator block 147 may be configured for multi-level comparisons. If, for example, average matric 108 is equal to or greater than a largest threshold 109, then such largest threshold 109 may be a pointer 146 to high code rate 142 in a LUT 145 for output of such high code rate 142 as code rate 112. Likewise, if, for example, average metric 108 is less than a largest threshold 109 and equal to or greater than a medium threshold 109, then such medium threshold 109 may be a pointer 146 to medium code rate 143 in a LUT 145 for output of such medium code rate 142 as code rate 112. If, for example, average metric 108 is less than a medium threshold 109 and equal to or greater than a low threshold 109, then such low threshold 109 may be a pointer 146 to low code rate 144 in a LUT 145 for output of such low code rate 142 as code rate 112. Lastly, if, for example, average metric 108 is less than a low threshold 109, then pointer 146 may provide a user an indication that SSD 100 is no longer sufficiently reliable for continued use and/or may provide an indication to memory controller 110 to address map around a block and/or sector associated with such poor reliability, as previously described.

Even though a high-medium-low control selection was described for purposes of clarity by way of example and not limitation, generally two or more code rates may be used with at least one threshold. Accordingly, an average metric 108 or other suitable metric may be used for selecting a code rate 112 among code rates by comparing such metric to a threshold. As a result of such comparison, a determination may be made as to whether to leave a code rate as is or to make an adjustment to a code rate responsive to such metric being below such threshold. Moreover, in another implementation, metrics, such as average metrics 108 for example, may be stored in association with code rates, such as a store of code rates in a LUT 145, for using a current metric for current decoded data 141 directly as a pointer to select a code rate 112. In such a configuration, thresholds 109 may be eliminated, as indicated by a dashed box therefor.

Accordingly, code rate can be modulated across a set of blocks and/or a set of sectors of solid-state storage 130 with increased life of SSD 100 as well as increased reliability. As SSD 100 degrades over time, code rate may be lowered causing lower throughput of data, namely data throughput of SSD 100 may be gradually reduced with gradually increasing higher-redundancy codes.

Figure 2:
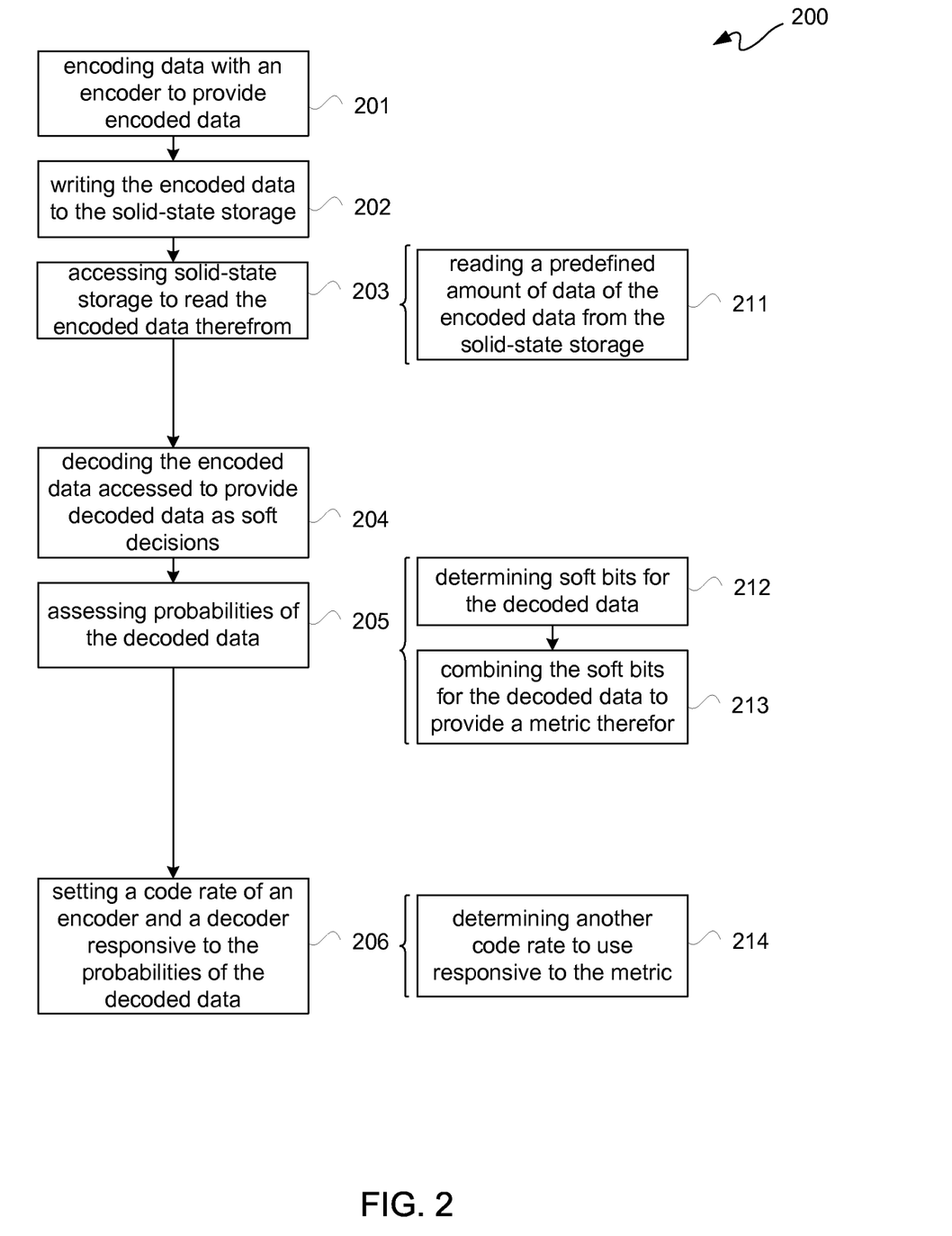
FIG. 2 is a flow diagram depicting an exemplary process flow for storing information.

FIG. 2 is a flow diagram depicting an exemplary process flow 200 for storing information. Process flow 200 is further described with simultaneous reference to FIGS. 1 and 2.

At 201, input data 111 may be encoded with encoder 120 to provide encoded data 121. At 202, such encoded data 121 may be written to solid-state storage 130 as stored data 133.

At 203, solid-state storage 130 may be accessed to read encoded stored data 133. As previously described, this access operation at 203 may include, at 211, reading a predefined amount of encoded data from solid-state storage 130. Such a predefined amount of data may be selected from a group consisting of a sector, a block, a subarray, and an array of solid-state storage 130.

At 204, encoded read data 131 accessed at 203 may be decoded by decoder 140 to provide decoded data 141 as soft decisions. In an implementation, such soft decisions are indicative of the probability a bit represents a "0" or "1" for binary coded data. At 205, probabilities of decoded data 141 may be assessed by statistical engine 106, such as previously described. This assessment operation at 205 may include determining soft bits for decoded data at 212 and, at 213, combining magnitudes of such soft bits determined for such decoded data 141 to provide a metric therefor, such as for example an average metric 108.

Accordingly, decoder 140 may be a soft-in soft-out ("SISO") decoder in contrast to a hard decoder. In other words, read data 131 may take on values other than just fixed binary values of logic 1 or 0 in order to indicate reliability of such read data. Likewise, decoded data 141 may take on values other than just a fixed set of values, such as binary values of logic 1 or 0 in a binary code for example, in order to indicate reliability of such decoded data. Thus, as a soft-decision decoder 140, decoder 140 is to be contrasted with a hard-decision decoder.

Moreover, these soft decisions may range from negative to positive values conventionally respectively for reliability of logic 0s and logic 1s. Thus, by using magnitudes, as previously described, strength of such reliability information may be determined. For example, a range of −127 to +127 may be used for representing soft decisions as soft bits, where soft bits with a −127 value indicate a highest reliability for a logic 0 and soft bits with a +127 value indicate a highest reliability for a logic 1.

At 206, a code rate of an encoder 120 and a decoder 140 may be adjusted or set, including without limitation replacing a current code rate with a lower code rate, responsive to probabilities of decoded data 141, such as previously described. This adjustment or setting operation at 206 may include at 214 determining, including without limitation selecting, another code rate to use responsive to a metric determined for such probabilities of decoded data 141.

Memory controller 110 may be implemented at least in part using programmable resources of a field programmable gate array ("FPGA"). Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 3:
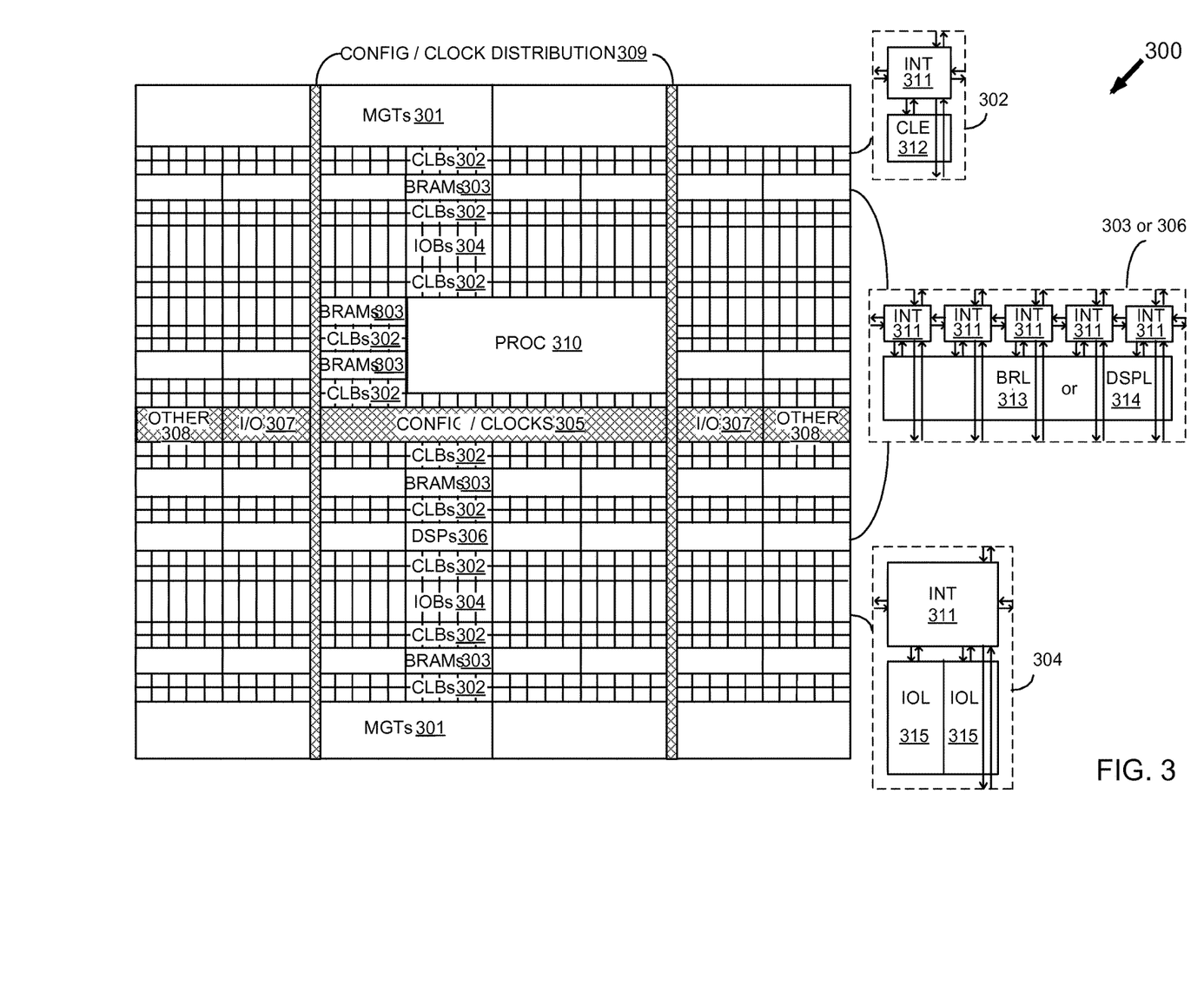
FIG. 3 is a simplified block diagram depicting an exemplary columnar Field Programmable Gate Array ("FPGA") architecture.

As noted above, advanced FPGAs can include several different types of programmable logic blocks in the array. For example, FIG. 3 illustrates an FPGA architecture 300 that includes a large number of different programmable tiles including multi-gigabit transceivers ("MGTs") 301, configurable logic blocks ("CLBs") 302, random access memory blocks ("BRAMs") 303, input/output blocks ("IOBs") 304, configuration and clocking logic ("CONFIG/CLOCKS") 305, digital signal processing blocks ("DSPs") 306, specialized input/output blocks ("I/O") 307 (e.g., configuration ports and clock ports), and other programmable logic 308 such as digital clock managers, analog-to-digital converters, system monitoring logic, and so forth. Some FPGAs also include dedicated processor blocks ("PROC") 310.

In some FPGAs, each programmable tile includes a programmable interconnect element ("INT") 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 can include a configurable logic element ("CLE") 312 that can be programmed to implement user logic plus a single programmable interconnect element ("INT") 311. A BRAM 303 can include a BRAM logic element ("BRL") 313 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element ("DSPL") 314 in addition to an appropriate number of programmable interconnect elements. An IOB 304 can include, for example, two instances of an input/output logic element ("IOL") 315 in addition to one instance of the programmable interconnect element 311. As will be clear to those of skill in the art, the actual I/O pads connected, for example, to the I/O logic element 315 typically are not confined to the area of the input/output logic element 315.

In the pictured embodiment, a horizontal area near the center of the die (shown in FIG. 3) is used for configuration, clock, and other control logic. Vertical columns 309 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, processor block 310 spans several columns of CLBs and BRAMs.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

However, in another implementation of SSD 100 of FIG. 1, statistical engine 106 may be implemented in firmware of memory controller 110, and encoder 120 and decoder 140 may be implemented in hardware, and SSD 100 may be coupled internally or externally to a computer system.

Figure 4:
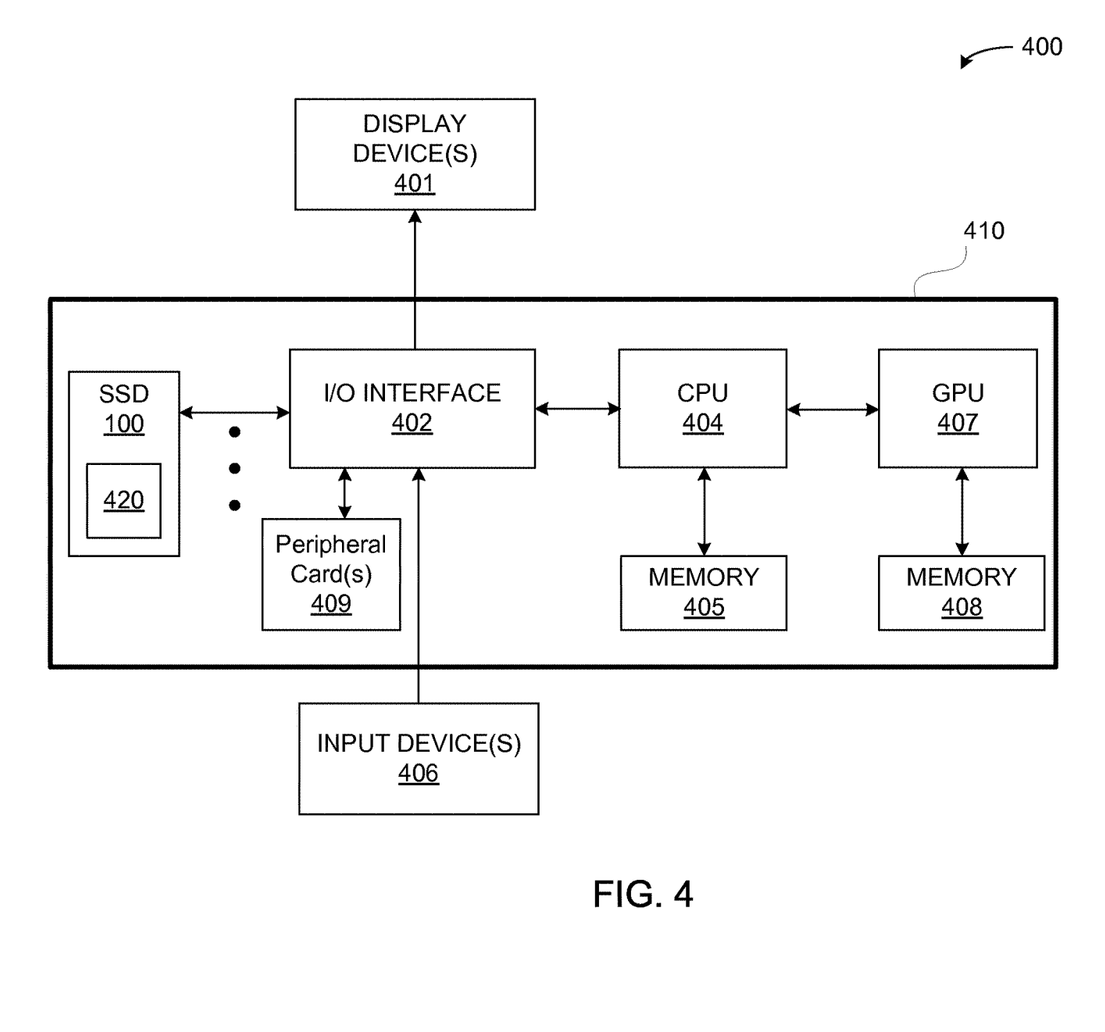
FIG. 4 is a block diagram depicting an exemplary computer system.

Along those lines, FIG. 4 is a block diagram depicting an exemplary computer system 400. Computer system 400 may include a programmed computer 410 coupled to one or more display devices 401, such as Cathode Ray Tube ("CRT") displays, plasma displays, Liquid Crystal Displays ("LCD"), projectors and to one or more input devices 406, such as a keyboard and a cursor pointing device. Other known configurations of a computer system may be used. Computer system 400 by itself or networked with one or more other computer systems 400 may provide an information handling system.

Programmed computer 410 may be programmed with a known operating system, which may be Mac OS, Java Virtual Machine, Real-Time OS Linux, Solaris, iOS, Android Linux-based OS, Unix, or a Windows operating system, among other known platforms. Programmed computer 410 includes a central processing unit (CPU) 404, memory 405, and an input/output ("I/O") interface 402. Programmed computer 410 may optionally include a graphics processing unit ("GPU") 407 coupled to CPU 404 and one or more peripheral cards 409 coupled to I/O interface 402. Along those lines, program computer 410 may include graphics memory 408 coupled to optional GPU 407.

CPU 404 may be a type of microprocessor known in the art, such as available from IBM, Intel, ARM, and Advanced Micro Devices for example. CPU 404 may include one or more processing cores. Support circuits (not shown) may include cache, power supplies, clock circuits, data registers, and the like.

Memory 405 may be directly coupled to CPU 404 or coupled through I/O interface 402. At least a portion of an operating system may be disposed in memory 405. Memory 405 may include one or more of the following: flash memory, random access memory, read only memory, magneto-resistive read/write memory, optical read/write memory, cache memory, magnetic read/write memory, and the like, as well as non-transitory signal-bearing media as described below. Along those lines, memory 405 may include SSD 100, which is coupled to I/O interface 402, such as through a Serial ATA ("SATA") bus or other bus. SSD 100 is shown separately from memory 405 for purposes of clarity. Moreover, one or more SSDs 100 may be used, as generally indicated such as for RAID or other multiple drive storage for example.

I/O interface 402 may include chip set chips, graphics processors, and/or daughter cards, among other known circuits. In this example, I/O interface 402 may be a Platform Controller Hub ("PCH"). I/O interface 402 may be coupled to a conventional keyboard, network, mouse, display printer, and interface circuitry adapted to receive and transmit data, such as data files and the like.

Programmed computer 410 may optionally include one or more peripheral cards 409. An example of a daughter or peripheral card may include a network interface card ("NIC"), a display interface card, a modem card, and a Universal Serial Bus ("USB") interface card, among other known circuits. Optionally, one or more of these peripherals may be incorporated into a motherboard hosting CPU 404 and I/O interface 402. Along those lines, GPU 407 may be incorporated into CPU 404 and/or may be of a separate peripheral card.

Programmed computer 410 may be coupled to a number of client computers, server computers, or any combination thereof via a conventional network infrastructure, such as a company's Intranet and/or the Internet, for example, allowing distributed use. Moreover, SSD 100 may be directly coupled to such a network as a network drive, without having to be directly internally or externally coupled to programmed computer 410. However, for purposes of clarity and not limitation, it shall be assumed that SSD 100 is housed in programmed computer 410.

Memory 405 may store all or portions of one or more programs or data to implement processes in accordance with one or more embodiments hereof to provide program product 420. As previously described, program product 420 may be implemented in firmware of memory controller 110 of SSD 100 for implementing process flow 200, as well as statistical engine 106. Additionally, those skilled in the art will appreciate that one or more embodiments hereof may be implemented in hardware, software, or a combination of hardware and software. Such implementations may include a number of processors or processor cores independently executing various programs, dedicated hardware and/or programmable hardware.

One or more program(s) of program product 420, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD). The above embodiments specifically include information downloaded from the Internet and other networks. Such non-transitory signal-bearing media, when carrying computer-readable instructions that direct functions hereof, represent implementations hereof.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for managing reliability of a solid-state storage, comprising:
   reading encoded data stored in the solid-state storage;
   decoding the encoded data accessed to provide decoded data as soft decisions representing probabilities of the decoded data;
   assessing the probabilities of the decoded data; and
   adjusting a code rate of an encoder and a decoder responsive to the assessment of the probabilities of the decoded data.

2. The method according to claim 1, wherein the code rate is for a linear error correcting code.

3. The method according to claim 2, wherein the solid-state storage comprises memory cells selected from a group consisting of multi-level cells, binary cells, triple-level cells, and single-level cells for storage of the encoded data.

4. The method according to claim 2, wherein:
   the encoder is a Low-Density Parity-Check ("LDPC") encoder; and
   the decoder is an LDPC decoder.

5. The method according to claim 1, further comprising:
   encoding input data with the encoder to provide the encoded data; and
   writing the encoded data to the solid-state storage.

6. The method according to claim 5, wherein the accessing comprises reading a predefined amount of the encoded data from the solid-state storage.

7. The method according to claim 6, wherein the predefined amount is selected from a group consisting of a sector, a block, a subarray, and an array of the solid-state storage.

8. The method according to claim 1, wherein the code rate is a first code rate, the method further comprising:
   determining soft bits for the decoded data;
   combining magnitudes of the soft bits for the decoded data to provide a metric therefor; and
   determining a second code rate lower than the first code rate to use responsive to the metric.

9. The method according to claim 8, further comprising blocking use of a predefined amount of the solid-state storage responsive to the metric.

10. The method according to claim 9, wherein:
    the blocking includes address mapping to prevent use of the predefined amount; and
    the predefined amount includes at least one block of a sector of the solid-state storage.

11. An apparatus for managing reliability of a solid state storage, comprising:

a memory controller for providing a code rate;
an encoder for receiving input data and the code rate for providing encoded data;
the solid-state storage for receiving and storing the encoded data;
a decoder for accessing the encoded data stored in the solid-state storage and for receiving the code rate for providing decoded data of the encoded data accessed;
the decoded data being provided as soft decisions representing probabilities of the decoded data; and
the memory controller for receiving the decoded data for adjusting the code rate responsive to the probabilities of the decoded data.

12. The apparatus according to claim 11, wherein the code rate is for a linear error correcting code.

13. The apparatus according to claim 11, wherein the solid-state storage comprises memory cells selected from a group consisting of multi-level cells, binary cells, triple-level cells, and single-level cells for storage of the encoded data.

14. The apparatus according to claim 11, wherein:
the encoder is a Low-Density Parity-Check ("LDPC") encoder; and
the decoder is an LDPC decoder.

15. The apparatus according to claim 11, wherein the decoder is a soft-in soft-out decoder.

16. The apparatus according to claim 11, wherein the solid-state storage is configured to read out the encoded data in a predefined amount.

17. The apparatus according to claim 16, wherein the predefined amount is selected from a group consisting of a sector, a block, a subarray, and an array of the solid-state storage.

18. The apparatus according to claim 11, wherein:
the decoder is configured to provide soft bits representing the probabilities for the decoded data; and
the memory controller is configured to combine magnitudes of the soft bits for the decoded data to provide a metric for selecting the code rate.

19. The apparatus according to claim 18, wherein the memory controller is further configured to:
compare the metric to a threshold; and
determine an adjustment of the code rate responsive to the metric being below the threshold.

20. The apparatus according to claim 18, wherein the memory controller is further configured to:
point to the code rate in a store of a plurality of code rates with the metric as a pointer; and
output, from the store of the plurality of code rates, the code rate pointed to.

* * * * *